United States Patent [19]

Chapman

[11] Patent Number: 5,667,156

[45] Date of Patent: Sep. 16, 1997

[54] PROCESS FOR THE SEPARATION AND ISOLATION OF PRECIOUS AND SEMI-PRECIOUS METALS FROM ELECTRONIC CIRCUIT BOARDS

[75] Inventor: Ray Chapman, Argyle, Tex.

[73] Assignee: Resource Concepts, Inc., Dallas, Tex.

[21] Appl. No.: 582,784

[22] Filed: Jan. 4, 1996

[51] Int. Cl.$^6$ .............................. B02C 19/00; B02C 19/12
[52] U.S. Cl. ........................... 241/24.13; 241/24.18; 241/79.1; 241/152.2; 241/DIG. 38
[58] Field of Search ........................... 241/24.13, 24.14, 241/24.18, 79.1, 152.2, DIG. 38

[56] References Cited

U.S. PATENT DOCUMENTS

| | | | |
|---|---|---|---|
| 2,942,792 | 6/1960 | Anderson et al. | |
| 3,848,813 | 11/1974 | Stanczyk et al. | 241/19 |
| 3,885,744 | 5/1975 | Drage | 241/23 |
| 3,905,556 | 9/1975 | Drage . | |
| 4,026,477 | 5/1977 | Tremolada . | |
| 4,042,177 | 8/1977 | Cestaro et al. | |
| 4,044,956 | 8/1977 | Benedetto et al. | |
| 4,098,464 | 7/1978 | Niedner et al. | 241/24 |
| 4,384,683 | 5/1983 | Huwald et al. | |
| 4,397,424 | 8/1983 | Zappa et al. | |
| 4,414,076 | 11/1983 | Tabatabaie-Alavi . | |
| 4,494,995 | 1/1985 | Tabatabaie-Alavi . | |
| 4,637,928 | 1/1987 | Zajac, Jr. et al. | |
| 4,815,668 | 3/1989 | Frei | 241/23 |
| 5,139,203 | 8/1992 | Alavi . | |
| 5,217,171 | 6/1993 | Feldman . | |
| 5,356,082 | 10/1994 | Prinz et al. | 241/24 |
| 5,377,920 | 1/1995 | Alavi et al. | |

FOREIGN PATENT DOCUMENTS

3347230 A1   11/1985   Germany .

OTHER PUBLICATIONS

R.S. Kaplan and H. Ness. "Review Article No. 13—Recycling of Metals"—*Conservation & Recycling*, vol. 10, No. 1, pp. 1–13, 1987. Printed in Great Britain.

*Primary Examiner*—John M. Husar
*Attorney, Agent, or Firm*—R. Darryl Burke; Worsham, Forsythe & Wooldridge, L.L.P.

[57] ABSTRACT

Preferred processes to separate metallic and non-metallic constituent components of at least one electronic product are generally comprised of the following steps: (a) repeatedly crushing the at least one electronic product to create a plurality of crushed electronic components; (b) repeatedly screening the plurality of crushed electronic components to ensure that the plurality of crushed electronic components substantially conform to a specific size; and (c) separating the plurality of crushed electronic components after steps (a) and (b) into non-metallic constituent components and metallic constituent components by weight. In addition, before step (a), the at least one electronic product must be provided or otherwise transported to crushing machines to perform step (a). Likewise, the crushed electronic components must be transported from one crushing machine to another crushing machine and to the separating apparatus to perform step (c). At least three crushing machines are generally used, so that the at least one electronic product are generally crushed at least three times (and transported between the crushing machines). The crushed electronic products are also periodically screened, such as after each crushing step to limit the size of the crushed materials in the stream of crushed materials being evaluated. Lightweight material is also removed from the stream of crushed materials by at least one air separator. Portions of the light weight material that comprise metallic material are returned to the stream of crushed material. Portions of lightweight material substantially comprised of non-metallic materials (i.e., dust) is transported to a collection apparatus. The products can be shredded before step (a).

41 Claims, 5 Drawing Sheets

PROCESS FOR THE SEPARATION AND ISOLATION OF PRECIOUS AND SEMI-PRECIOUS METALS FROM ELECTRONIC CIRCUIT BOARDS

PARTIAL WAIVER OF COPYRIGHT PURSUANT TO 1077 O.G. 22 (Mar. 20, 1987)

© Copyright, Ray Chapman 1996. All of the material in this patent application is subject to copyright protection under the copyright laws of the United States and of other countries. As of the first effective filing date of the present application, this material is protected as unpublished material.

However, permission to copy this material is hereby granted to the extent that the owner of the copyright rights has no objection to the facsimile reproduction by anyone of the patent document or patent disclosure, as it appears in the United States Patent and Trademark Office patent file or records, but otherwise reserves all copyright rights whatsoever.

FIELD OF INVENTION

In general, the present invention relates to an apparatus and process for separating the constituent components of Printed Wiring Assemblies (hereinafter "PWA's") and Printed Wiring Boards (hereinafter "PWB's") (i.e., the unpopulated boards and trim scrap from which the unpopulated boards are produced). In particular, the invention relates to a dry, mechanical process and an associated apparatus whereby PWA's or PWB's are successively and repeatedly crushed into a granular mixture of materials, which may be separated into granular forms of nonmetallic and metallic constituent components suitable for reclamation recycling, and reuse.

CROSS-REFERENCE TO RELATED APPLICATIONS

This application hereby incorporates by reference the following patent applications and, when issued, patents:

| Docket No. | Patent Serial No. | Filing Date/ Issue Date | |
|---|---|---|---|
| 3685-002000 | 08/582,788 | 01/04/96 | Process for the Separation and Isolation of Precious and Semi-Precious Metals from Electronic Circuit Boards |
| 3685-002002 | 08/582,780 | 01/04/96 | Apparatus and Process for the Separation of the Metallic and Non-Metallic Constituent Components of Printed Wiring Assemblies and Printed Wiring Boards having and using a Feedback Path |
| 3586-002003 | 08/582,778 | 01/04/96 | Apparatus and Process for the Separation of the Metallic and Non-Metallic Constituent Components of Printed Wiring Assemblies and Printed Wiring Boards having and using a Feedback Path |

BACKGROUND

Over the past three decades, since the inception of the integrated circuit and the computer, consumer acceptance combined with technological advances has produced an exceptionally strong market for electrical/electronic products that use integrated circuits and computers for the distribution and manipulation of information and data. The integrated circuits are often encapsulated in ceramic packages, mounted on PWB's to form PWA's, and, ultimately, packaged in various electrical or electronic equipment and appliances (i.e., plastic compartments). PWA's have become ubiquitous in such items as personal and business computers, telecommunications equipment, television sets, and other consumer electronic systems. Normal wear-and-tear and the extraordinary rate of technological change in the capabilities PWA's and PWB's have combined to produce a dramatic increase in the amount of obsolete electronic equipment produced in recent years. Despite the fact that much of this unusable or unwanted equipment contains a multitude of hazardous ingredients including copper and lead, much of this equipment is disposed of by simply plating it in private or municipal landfill sites. This approach is problematic for a variety of reasons. For instance, this approach has the potential for leaking toxic materials into the environment (i.e., water table). In addition, this approach unnecessarily dedicates limited landfill capacity. Consequently, consumer, business, and governmental entities are increasingly directed at the ecologically sound disposal of such equipment and have an intensifying interest in recycling the raw materials such equipment contains.

The disposal of PWA's and PWB's, however, involves special problems. Some of the special problems of properly disposing and/or recycling electrical/electronic equipment and appliances relate to the manner in which PWA's and PWB's are manufactured. PWB's are made by laminating two or more layers of fiberglass reinforced epoxy or polyimide resins with copper foil. The laminate is then coated with a metallic material, usually copper, upon which circuits are traced by a variety of imaging and etching techniques. In addition to quality defects that produce unusable PWB's, the process for producing finished, etched PWB's creates up to 20% waste as trim scrap. Because the material from which PWB's are made is a thermoset, the base can not be remelted and reused once it is produced. Similarly, PWA's are produced from PWB's by soldering or otherwise affixing functional components, such as chips of integrated circuit (hereafter "IC's"), connectors and other components to the base. The composition of these components includes such precious metals as Gold, Silver, Palladium and Platinum which are encapsulated in ceramic or epoxy resins.

Some existing techniques dispose of PWA's and PWB's in the following fashion. PWA's may be stripped of any reusable components. The partially depopulated PWA's are then sent to a smelter where they are pyrolized to burn off volatile constituents and then crushed. The resulting ash is then reduced by melting and the precious and semi-precious metals are recovered through several pyrometallurgical stages. The value of the precious metals is then calculated, after subtracting the cost of the smelting process, and this value is returned to the supplier of the PWA's.

This process has several disadvantages when complete PWA's are sent directly to smelters:

the smelting process is inherently costly in term of energy usage;

the pryolsis process produces air pollutants that must be scrubbed from oven stacks or otherwise converted into carbon dioxide, which is an environmentally unfriendly substance;

the resulting "sludge" from the smelting process is returned to the landfill, which uses up limited landfill capacity and, in some circumstances, may leak into the environment; and sampling techniques to determine the precious metal content of the PWA's prior to the smelting operation are impractical and unreliable.

Alternatives to the direct smelting of PWA's include techniques that seek to separate various metal constituent components from the non-metallic constituent components of complete electrical/electronic systems. These techniques include mechanical crushing of electrical/electronic units followed by magnetic separation to remove ferrous metals, followed either by sink flotation techniques to remove lighter weight non-metallic or metallic constituent components; or by density separation techniques followed by treatment of the resulting metallic or non-metallic portions with strong acids, bases or toxic cyanide; or by elaborate series of grinding and density separation steps to completely separate such metals as copper from aluminum and nickel. These approaches still require hazardous components such as Cathode Ray Tubes (CRT's), mercury switches, and Polychlorobiphenly containing capacitors, frequent components of electronic assemblies, to be removed manually. In addition, they involve chemical or water treatment that requires careful and costly monitoring of effluents for hazardous ingredients and/or are costly with respect to the value of the reclaimed materials.

SUMMARY

Generally, in preferred embodiments, PWA's, are removed from electrical or electronic systems, either manually or by a gross shredding operation that is performed on the assembled unit after hazardous items, such as CRT's, mercury switches and Polychlorobiphenyl containing capacitors, are removed. Alternatively, PWB's are simply provided to preferred embodiments. Then, PWB's and/or PWA's are successively and continuously crushed to reduce the overall size of the constituent components. The resulting constituent components contain a mixture of metallic and non-metallic base materials and are separated from one another using the specific gravity of the fractions of material produced. This mechanical process of repeated size reduction and separation generally renders PWA's or PWB's into three fractions: (A) a granular form of the metallic constituent that allows reproducible and reliable chemical analysis of its elemental composition and permits efficient reclamation of the precious elements through subsequent refining processes; (B) a finely ground form of non-metallic PWB base material, generally comprising fiberglass and epoxy or polyimide resin, a "fines" fraction; and (C) an extremely finely ground form of non-metallic dust generally comprising the fiberglass and binding resins from the PWB base. These fractions are produced in various proportions depending on the composition of the PWA or PWB feed stock. Fractions (B) and (C) may be combined, together or separately, with other materials to produce composites that may be used in construction or industrial applications. These applications include, but are not limited to, sinks, desktops, highway lane dividers, highway sound barriers, electronic component cases, chemically resistant floor grating, tile, shingles, molding compounds, highway speed regulators, kitchen and bathroom countertops, and wallboard. Therefore, all components of PWA's or PWB's can be returned to constructive use rather than being placed in landfill sites. Because this process is completely dry and requires no incineration or chemical treatment steps, associated problems of monitoring effluent water, air or chemical waste streams are avoided.

Specifically, preferred embodiments of the apparatus that are used to separate metallic and non-metallic constituent components from various types of PWA's/PWB's comprise a plurality of crushing machines, a plurality of conveyors, a plurality of screens, and at least one separating machine. The plurality of crushing machines (i.e., ring mills or hammer mills) generally have a first crushing machine and a second crushing machine, both of which have a corresponding entry port and exit port. In fact, each crushing machine of the plurality of crushing machines has a entry port and an exit port. Preferred embodiments use three (3) crushing machines. Likewise, the plurality of conveyors generally have a first conveyor and at least one second conveyor, both of which have a corresponding entry port and exit port. Once again, each conveyor also has a corresponding entry port and exit port. The conveyors are used to transport material after it has been crushed to and from the plurality of crushing machines. Three (3) closed conveyors are preferably used to transfer the material to and from the crushing machines. The series of three (3) crushing machines are used to successively reduce the size of the ground mixture prior to being supplied to the separating machine, thereby eliminating the need for further separating of the mixed products. Each crushing machine preferably has at least one screen affixed thereto which is positioned to regulate the flow of material generated or created by the crushing machine from the exit port. The screens allow passage of specifically sized products. The screens are collectively used to effectuate further size reduction of material in each crushing machine. The diameter of the openings in the screen of each crushing machine is progressively smaller than those in the preceding mill. For instance, the openings in the first screen preferably allow passage of specifically sized products having diameters in the range of $\frac{1}{16}"-2"$, whereas openings in the second screen preferably allow passage of specifically sized products having diameters in the range of $\frac{1}{16}"-1"$, and openings in the third screen allow passage of specifically sized products having diameters in the range of $\frac{1}{16}"-\frac{1}{2}"$. Of course, alternate diameters in the third screen are also preferred. The separating machine (i.e., gravity separator and fluidized bed separator) receives the crushed components from the plurality of crushing machines via the plurality of conveyors and separates the non-metallic constituent components from the metallic constituent components of PWA's/PWB's. The metallic constituent components are generally heavier than the non-metallic constituent components. A plurality of air separators may also be used to remove dust associated with the crushed PWA's/PWB's being transported by the plurality of conveyors. Each air separator has an air separator entry port and an air separator exit port and are mechanically linked with a collection apparatus (i.e., bag house filter) to collect the dust. Note the dust may be comprised of metallic and non-metallic portions. The heavier portions, which are largely comprised of metallic substances, are preferably not transported to a collection apparatus. Light weight portions of the airborne exit stream from each shredder and/or crushing machine are passed through an air separator, such as a cyclone air separator, which is a density classifier, to classify and separate heavier portions from lighter portions in order to allow heavier weight components to return to the processing stream thereby enriching the stream of material in metallic composition. The size-reduced stream is transported via a closed conveyor to the separator where metallic and non-metallic fractions from the process stream are separated based on specific gravity differences of the fractions. In addition, preferred embodiments may also comprise a shredder to shred PWA's/PWB's for initial size reduction before the PWA's/PWB's are crushed by the plurality of crushing machines for initial size reduction. A belt conveyor is preferably used to transfer the material to the plurality of crushing machines from the shredder.

Preferred processes to separate metallic and non-metallic constituent components of at least one electronic product are generally comprised of the following steps: (a) repeatedly crushing the at least one electronic product to create a plurality of crushed electronic components; (b) repeatedly screening the plurality of crushed electronic components to ensure that the plurality of crushed electronic components substantially conform to a specific size; and (c) separating the plurality of crushed electronic components after steps (a) and (b) into non-metallic constituent components and metallic constituent components by weight. In addition, before step (a), the at least one electronic product must be provided or otherwise transported to crushing machines to perform step (a). Likewise, the crushed electronic components must be transported from one crushing machine to another crushing machine and to the separating apparatus to perform step (c). As discussed above, preferred embodiments generally use at least three (3) crushing machines, so that the electronic product(s) is (are) generally crushed at least three (3) times (and transported between the crushing machines). The crushed electronic products are also periodically screened, such as after each crushing step to limit the size of the crushed materials in the stream of crushed materials being evaluated. Lightweight material is also removed from the stream of crushed materials by at least one air separator. Portions of lightweight material substantially comprised of non-metallic materials (i.e., dust) is transported to a collection apparatus. Portions of the light weight material that comprise metallic material are preferably returned to the stream of crushed material. The products can be shredded before step (a).

Specifically, preferred embodiments provide a number of advantages. Preferred embodiments substantially (and in some cases completely) recycle the constituents/components of PWA's and PWB's by separating the metallic from the non-metallic constituent components of which they are made and return all of these raw materials to reuse rather than sending them to a landfill, thereby reducing the dedication of limited landfill space to the disposal of electrical/ electronic equipment. Preferred embodiments do not require incineration or chemical or water treatment procedures, which avoids potential problems with air or water pollution, to separate metallic and non-metallic constituent components of PWA's/PWB's. In addition, preferred embodiments perform the separation and recovery of metallic and non-metallic constituent components in a cost efficient way and in a manner that reclaims the maximum amount of precious and semiprecious metals from these materials.

Other advantages of the invention and/or inventions described herein will be explained in greater detail below.

BRIEF DESCRIPTION OF THE DRAWINGS

The accompanying drawings are incorporated into and form a part of the specification to illustrate several examples of the present inventions. These drawings together with the description serve to explain the principles of the inventions. The drawings are only for the purpose of illustrating preferred and alternative examples of how the inventions can be made and used and are not to be construed as limiting the inventions to only the illustrated and described examples. Further features and advantages will become apparent from the following and more particular description of the various embodiments of the invention, as illustrated in the accompanying drawings, wherein.

DETAILED DESCRIPTION OF THE PREFERRED EMBODIMENT

Figure 1:
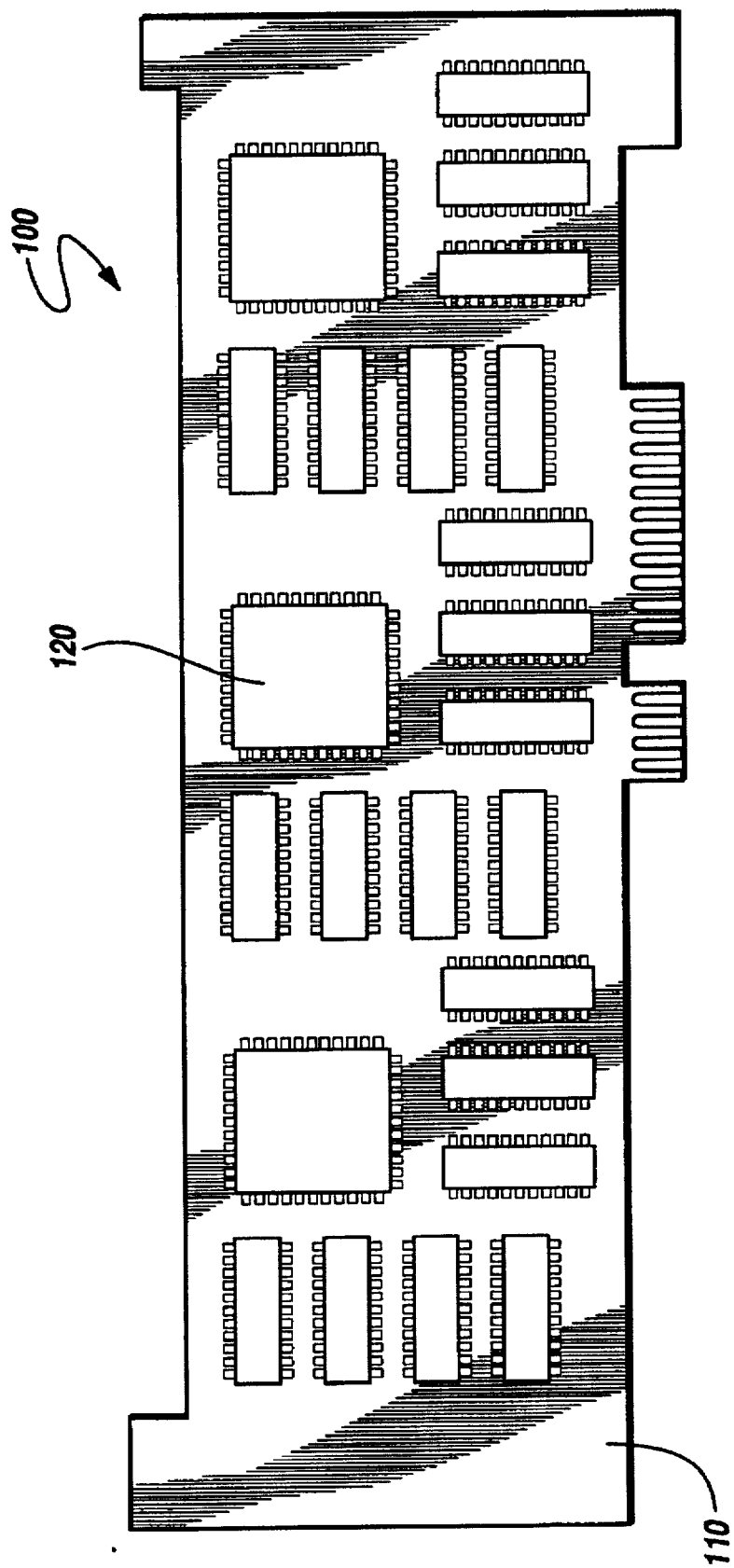
FIG. 1 is a top view of an illustration of a sample of a printed wiring assembly ("PWA") 100 having a printed wiring board ("PWB") 110 with electrical components 120 (i.e., encapsulated integrated circuits) placed thereon.

The present inventions will be described by referring to the preferred apparatus and method and by showing various examples of how the inventions disclosed herein can be made and used. When possible, like reference characters are used throughout the several views of the drawing to indicate like or corresponding parts. Specifically, the reference characters used in FIGS. 3, 4A, and 4B are intended to correspond to one another.

Figure 2:
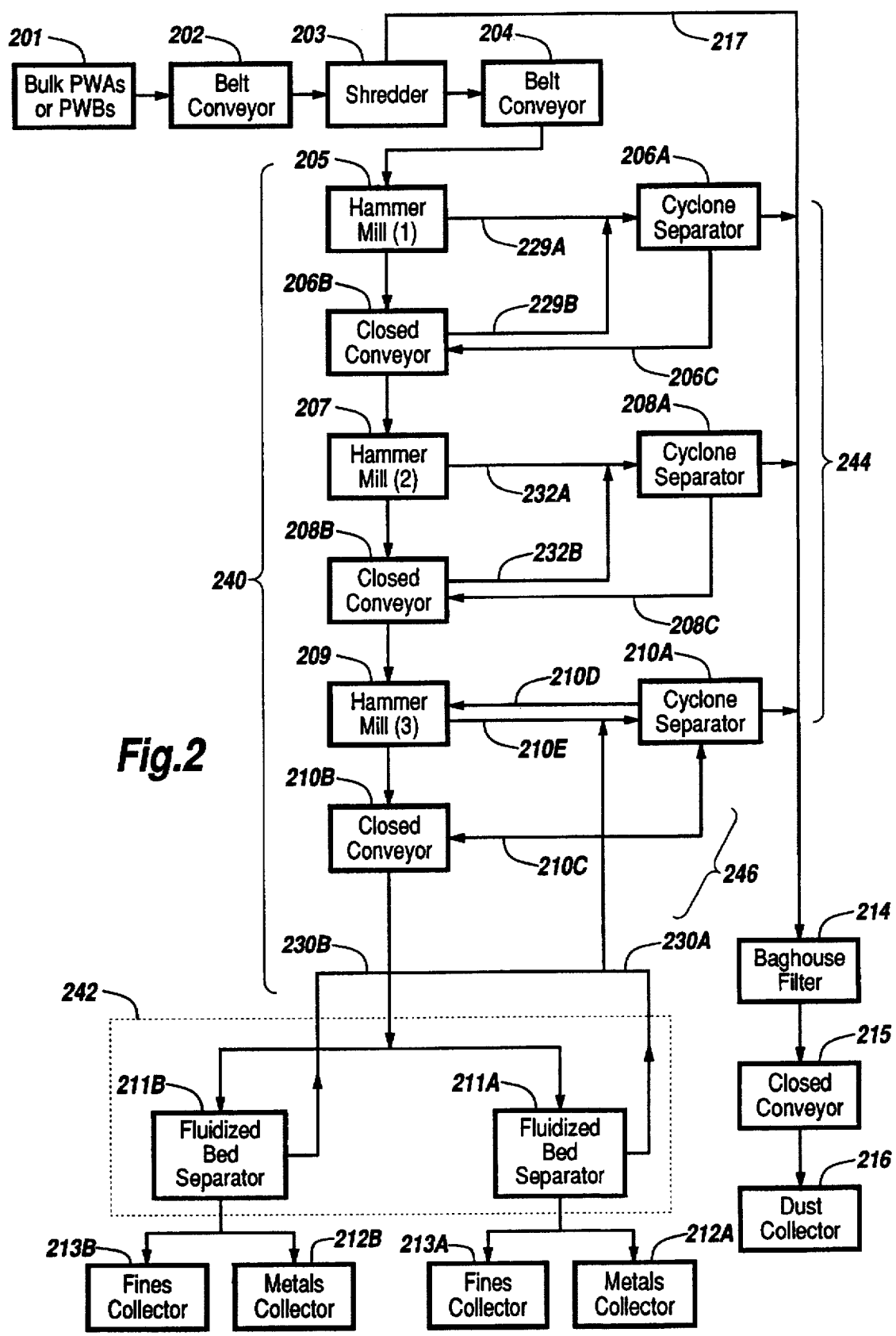
FIG. 2 is diagram illustrating the process flow 200 of a preferred processes to separate metallic and non-metallic components of PWA 100 and PWB 110.
Figure 3:
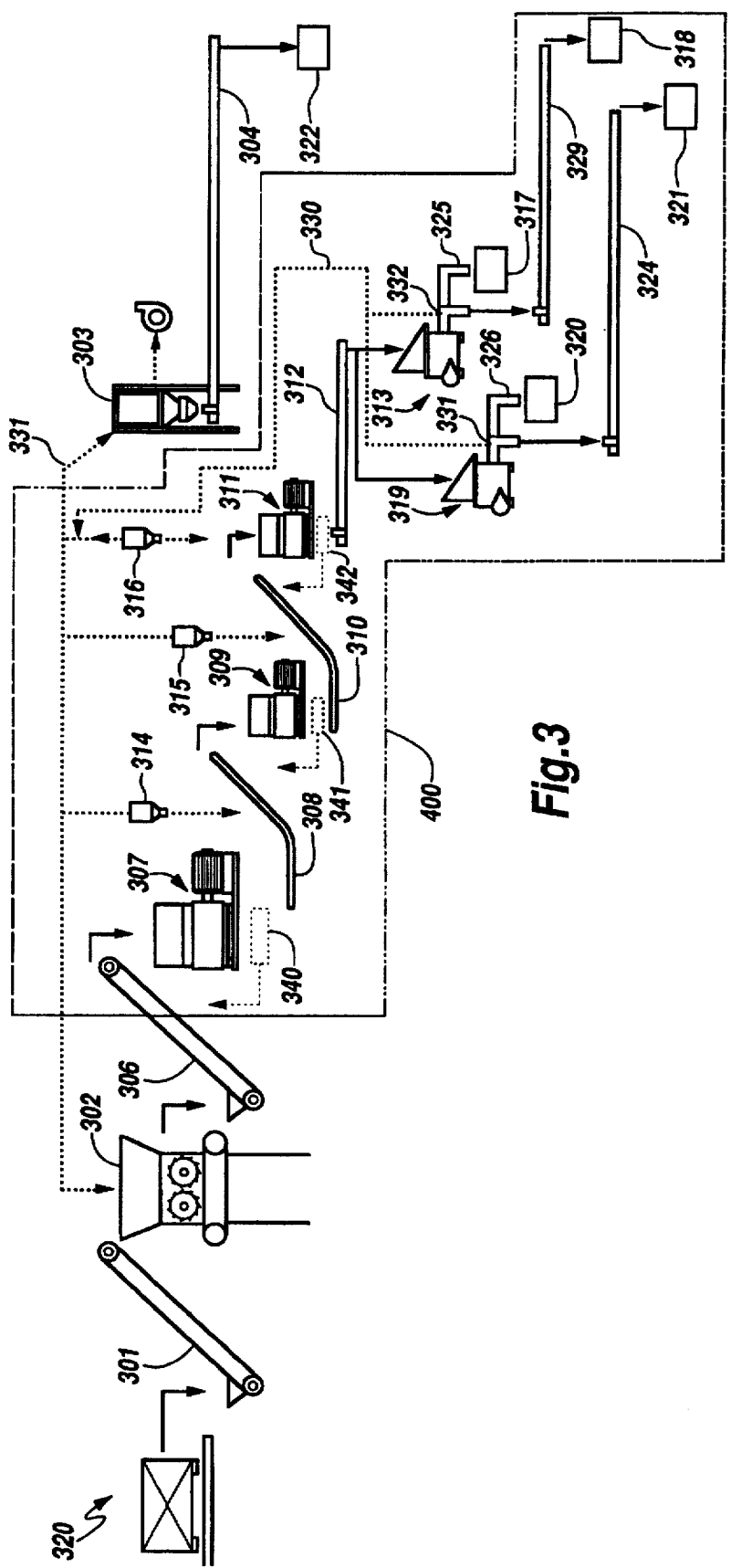
FIG. 3 is a diagram of a preferred embodiment showing the manufacturing line 300 used to implement the preferred process shown in FIG. 2.
Figure 4A:
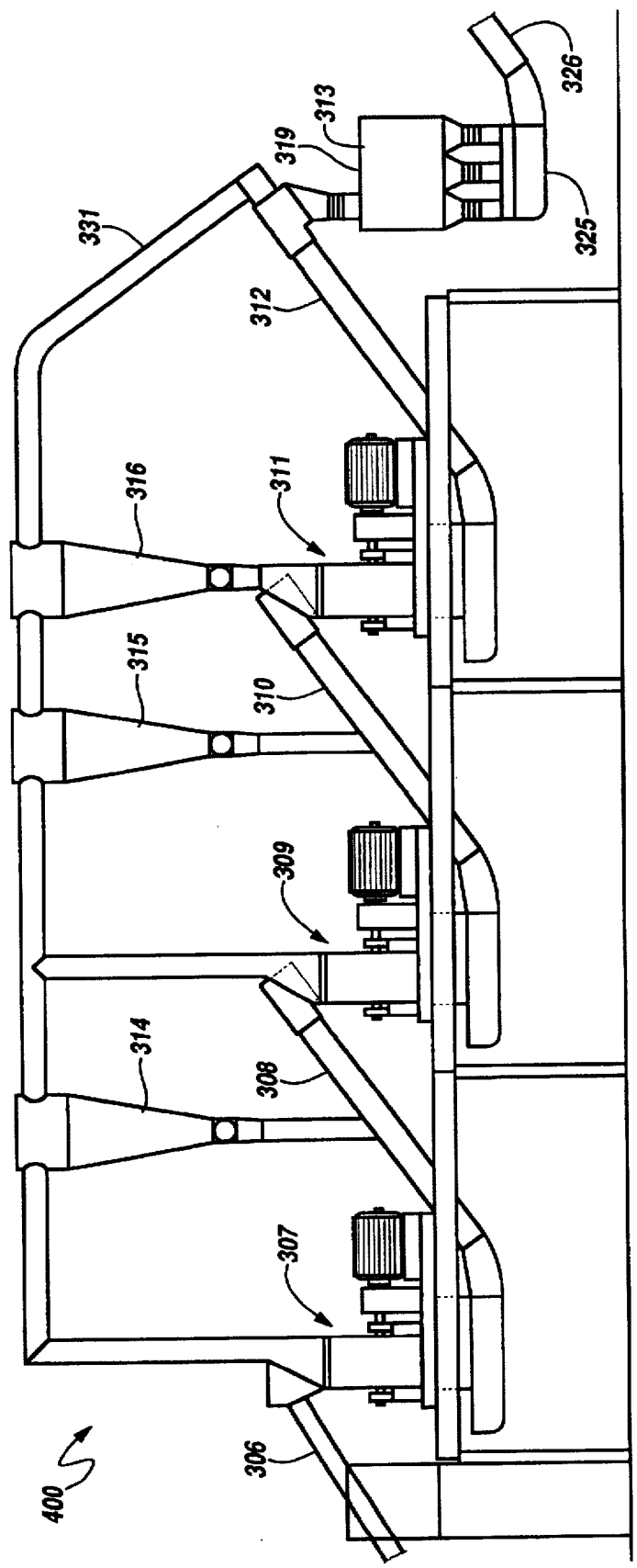
FIGS. 4A and 4B are elevation and line drawings of a portion 400 of the preferred embodiment shown in FIG. 3 used to implement the preferred process shown in FIG. 2.
Figure 4B:
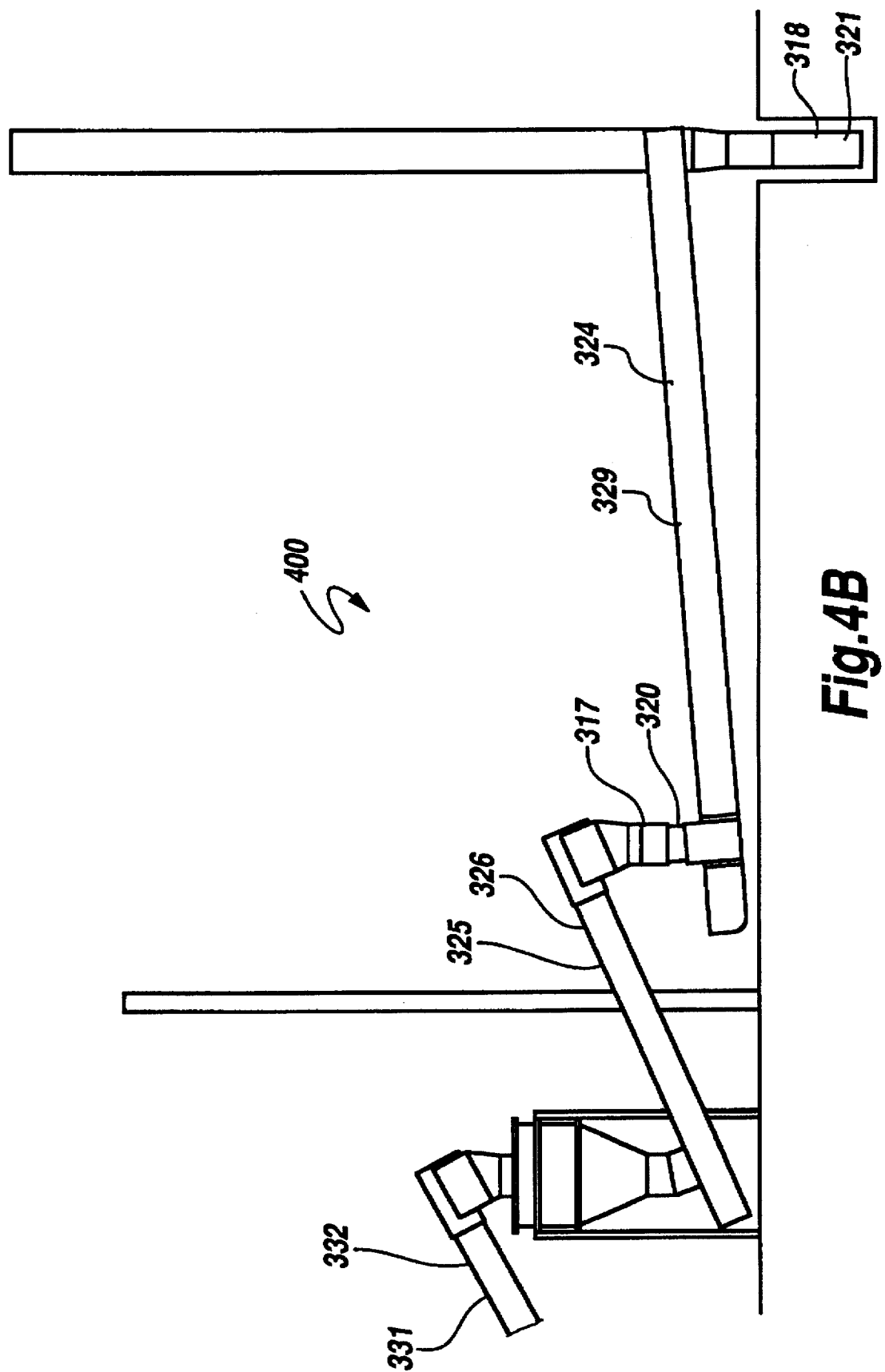

As shown in the flow diagram 200 in FIG. 2, step 201 entails providing bulk quantities of PWA's and/or PWB's, such as PWA 100 and/or PWB 110 having IC's 120 shown in FIG. 1 and container 350 in FIG. 3. Step 202 entails the placement of PWA's 100 and/or PWB's 110 onto belt conveyor 301 (in FIG. 3), which transports PWA's 100 and/or PWB's 110 into shredder 302 (in FIG. 3). Step 203 entails the shredding of these PWA's/PWB's, whereby they are reduced in size to figment nominally 3" in size. Shredder 302 is the primary shredder, but additional shredders can be used. Because shredder 302 is maintained under a (partial) vacuum, dust produced by the shredding operation is transported via a duct 331 in FIGS. 3 and 4A (shown as path 217 in FIG. 2) to a bag-house dust filter 303 in FIG. 3, which collects the dust, as shown in step 214 in FIG. 2. The dust is transported via closed conveyor 304 to dust collector 322, as shown in steps 215 and 216 in FIG. 2.

Referring to FIG. 2, first grouping 240 corresponds to a group of steps that generally crush and reduce the results from shredder 203 in FIG. 2 and shown as 302 in FIG. 3 in size. Step 204 in FIG. 2 shows the results from shredder 302 being transported via belt conveyor 306 in FIGS. 3 and 4A into a first crushing machine, such as first hammer mill 307 in FIGS. 3 and 4A. Step 205 refers to the crushing action of the first crushing machine, such as the hammers of hammer mill 307, combined with natural abrasion of the crushed particles against one another to reduce the size of the particles in it. First hammer mill 307 is fitted with a first screen 340 at its exit port with the diameter of screen openings in the approximate range of $\frac{1}{16}$" to 2", preferably in the range of 1" to 1¼". Consequently, the exit stream from first hammer mill 307 preferably contains particles with a maximum diameter equal to the diameter of screen openings of first screen 340. The exit stream from first hammer mill 307 is fed to first closed conveyor 308, referred to by step 206B in FIG. 2, and then into a second crushing machine, such as second hammer mill 309 (in FIGS. 3 and 4A), which is referred to by step 207 in FIG. 2. Second hammer mill 309 provides for further size reduction of the particles crushed by first hammer mill 307, which is referred to in step 207 in FIG. 2. Second hammer mill 309 preferably contains a second screen 341 which has openings with a diameter in the approximate range of 1/16" to 1", preferably in the range of 7/16"–9/16". Once again, particles exiting second hammer mill 309 have a maximum diameter equal to the diameter of these openings. As referenced in step 208B in FIG. 2, the exit stream from second hammer mill 309 is then fed via second closed conveyor 310, referred to by step 208B in FIG. 2, into a third crushing machine, such as third hammer mill 311 in FIGS. 3 and 4A. The crushing operation performed by third hammer mill 311 is referred to by step 209 in FIG. 2. Third hammer mill 311 contains a third screen 342 at its exit port that has openings with a diameter in the approximate range of 1/16"–1/2", preferably in the range of 3/16"–5/16". The size reduction associated with hammer mill 311 results in particles having a maximum diameter equal to the size of the screen opening. These particles exit third hammer mill 311 and are transported via third closed conveyor 312, which is referred to by step 210B, to first fluidized bed separator 313, which is referred to by step 211A. Note, as shown in FIGS. 2, 3, and 4A, additional fluidized bed separators may be used, such as second fluidized bed separator 319 (in FIG. 3), which is referred to by step 211B in FIG. 2. The dotted lines in FIG. 2 are intended to denote this option.

Third grouping 244 corresponds to a group of steps that generally remove light-weight metallic and non-metallic portions from the stream, separate light-weight non-metallic and metallic portions, and return light-weight metallic portions to the stream. As discussed above, first hammer mill 307, second hammer mill 309, and third hammer mill 311 are maintained under a (partial) vacuum, so that lighter weight portions, which may contain some metallic material from the feed-stock of crushed PWA's/PWB's are transported to first cyclone air separator 314, second cyclone air separator 315, and third cyclone air separator 316 in FIG. 3, respectively. Steps 206A, 208A, and 210A in FIG. 2 denote this operation, respectively. The configuration of first cyclone air separator 314, second cyclone air separator 315, and third cyclone air separator 316 further separates these lighter weight portions and allows heavy particles from such airborne mixtures to fall, under the force of gravity, into first closed conveyor 308, second closed conveyor 310, and third closed conveyor 312 respectively, where these particles are returned to the processing stream, which are illustrated by paths 206C, 208C, 210C and 210D in FIG. 2. FIGS. 3, 4A, and 4B show these particles being returned to the processing stream via paths 206C, 208C, and 210D, but an additional path could be added to the preferred embodiment shown in FIGS. 3, 4A, and 4B to correspond to path 210C, as shown in FIG. 2. Also, as shown in FIGS. 4A and 4B, first cyclone air separator 314 may also pull light-weight non-metallic and metallic portions from first hammer mill 307 via path 230A in FIG. 2. And, as shown in FIGS. 3, 4A, and 4B, first cyclone air separator 314 may also pull light-weight metallic and non-metallic portions from first closed conveyor 308 via path 230B in FIG. 2. Similarly, as shown in FIGS. 4A and 4B, second cyclone air separator 315 may also pull light-weight metallic and non-metallic portions from second hammer mill 309 via path 232A in FIG. 2. And, as shown in FIGS. 3, 4A, and 4B, second cyclone air separator 315 may also pull light-weight metallic and non-metallic portions from second closed conveyor 310 via path 232B in FIG. 2. Dust particles that are generally comprised of non-metallic substances from first cyclone air separator 314, second cyclone air separator 315, and third cyclone air separator 316 are transported via ducts 331 (shown in path 217 in FIG. 2) to baghouse 303 in FIGS. 3, 4, and 4B and ultimately via fourth closed conveyor 304 to dust collector 322, which are highlighted by steps 214, 215, and 216 in FIG. 2.

As shown in FIGS. 2 and 3, second grouping 242 corresponds to a group of steps that generally separate light-weight non-metallic and metallic portions from of the stream being separated by first gravity separator 313 and second gravity separator 319. Referring to first gravity separator 313, such as a fluidized fed separator, the finely sized reduced stream flows over a inclined vibrating deck, where through the action of air blown from below the deck and vacuum pulling from above, a fluidized bed of air is produced upon which the mixture of size reduced metals and non-metallic base are separated, based on the differences in their specific gravity. The (partial) vacuum in first gravity separator 313 causes airborne dust to be transported via a duct 330 in FIGS. 3 and 4A to third cyclone air separator 316 and heavier weight particles are separated and passed back through first gravity separator 313, as shown in FIG. 2 as paths 230A and 230B. Paths 229A and 229B from first gravity separator 313 and second gravity separator 319 to third cyclone air separator 316 along with third cyclone air separator 316 and the other paths connected to third cyclone air separator 316, such as path 210C, 210D, and 120E generally work together to form fourth grouping 246 to remove light-weight metallic and non-metallic portions, separate non-metallic from metallic portions, and return light-weight metallic portions to the stream. Dust particles that are generally comprised of non-metallic substances from third air separator 316 are transported via duct 331 to bag-house filter 303 and into dust collector 322. The staged sequence of size reduction and separation allows easy segregation between the heavier metals portion at the top of the deck, which is discharged to first metal collection container 317 in FIGS. 3 and 4B and the lighter weight fines portion, which is discharged to first fines collection container 318 in FIGS. 3 and 4B, which are referred to as steps 212A and 213A in FIG. 2. Lighter weight fines portion are transferred to first fines collection container 318 via fifth closed conveyor 329 in FIGS. 3 and FIG. 4B. As a result, since the heavier dust portions are returned to the stream by first air separator 314, second air separator 315, and third air separator 316, the stream is constantly enriched with material that is substantially comprised of metallic portions. Also, note in FIGS. 3, 4A, and 4B that the output of first gravity separator 313 is split into two sections 332 and 325 in which section 332 discharges the first fines on fifth closed conveyor 329 to first fines collection container 318. Section 325 directly discharges the heavier weight particles into first metal collection container 317.

Also, depending on the size of first hammer mill 307, second hammer mill 309, and third hammer mill 311 and the attendant flow rate, alternate preferred embodiments may split up the stream of material from third closed conveyor 312 into two or more sub-streams, so that the material flows into first gravity separator 313 and into second gravity separator 319, both of which are preferably fluidized bed separators, which are illustrated by steps 211A and 211B in FIG. 2. Additionally, depending upon the size of the mills and their respective flow rates, additional separators may be incorporated. Such a configuration prevents first gravity separator 313 from becoming overloaded. Alternate preferred embodiments may also produce approximately equivalent separation in both first gravity separator 313 and second gravity separator 319. Granulated metals may then be collected in both first metal collector 317 (step 212A in FIG. 2) and second metal collector 320 as fines are collected in both first fines collector 318 and second fines collector 321. As with first gravity separator 313, airborne dust in second gravity separator 319 is transported, via a duct 330, back through third cyclone air separator 316 and then back to first gravity separator 313 and second gravity separator 319. Lighter weight fines portion are transferred to second fines collection container 321 via sixth closed conveyor 324 in FIGS. 3 and 4B. Also, note in FIGS. 3 and 4A that the output of second gravity separator 319 is split into two sections 331 and 326 in which section 331 discharges the first fines on sixth closed conveyor 324 to second fines collection container 321. Section 326 directly discharges the heavier weight particles into second metal collection container 320.

FURTHER MODIFICATIONS AND VARIATIONS

Although the invention has been described with reference to a specific embodiment, this description is not meant to be construed in a limiting sense. The example embodiments shown and described above are only exemplary. Various modifications of the disclosed embodiment as well as alternate embodiments of the invention will become apparent to persons skilled in the art upon reference to the description of the invention. Alternate machinery may be used to separate the particles, other than that shown and discussed above. For instance, alternative crushing machines may be selected from a list including, but not limited to, Radial Knife Granulators, Roll Crushers, Jaw Crushers, Ball Mills, Disk Granulators, Impact Mills, and the like. Alternative air separators may be selected from a list including, but not limited to, Air Classifiers, Air Stratifyers, Centrifugal Air Classifiers, Venturi Separators, Trickle Vane Separators, Rising Current Density Separators, and the like. Alternative separators to gravity separators may be selected from a list including, but not limited to, Electrostatic Separators, Electrodynamic Separators, Vibrating Screen Separators, Destoners, and the like. Likewise, the number of crushing machines, conveyor belts, separators, and screens may vary as well, depending on the particular application. Thus, even though numerous characteristics and advantages of the present inventions have been set forth in the foregoing description, together with details of the structure and function of the inventions, the disclosure is illustrative only, and changes may be made in the detail, especially in matters of shape, size and arrangement of the parts within the principles of the inventions to the full extent indicated by the broad general meaning of the terms used in the attached claims. Accordingly, it should be understood that the modifications and variations suggested above and below are not intended to be exhaustive. These examples help show the scope of the inventive concepts, which are covered in the appended claims. The appended claims are intended to cover these modifications and alternate embodiments. In short, the restrictive description and drawings of the specific examples above are not intended to point out what an infringement of this patent would be, but are to provide at least one explanation of how to make and use the inventions contained herein. The limits of the inventions and the bounds of the patent protection are measured by and defined in the following claims.

What is claimed is:

1. A process to isolate precious and semi-precious metals from at least one electronic circuit board, comprising the following steps:

(a) repeatedly crushing and reducing by size said at least one electronic circuit board with at least one crushing and size reducing apparatus to create a plurality of crushed electronic components that substantially confirm to a specific size;

(b) separating said plurality of crushed electronic components received from said at least one crushing and size reducing apparatus after step (a) into at least one non-metallic constituent component and at least one metallic constituent component by weight with at least one separating apparatus;

(c) continuously removing at least one first light-weight non-metallic constituent component and at least one first light-weight metallic constituent component from said at least one crushing and size reducing apparatus, continuously separating said at least one first light-weight non-metallic constituent component from said at least one first light-weight metallic constituent component, and continuously returning said at least one first light-weight metallic constituent component to said at least one crushing and size reducing apparatus, simultaneously with step (a); and (d) continuously removing at least one second light-weight non-metallic constituent component and at least one second light-weight metallic constituent component from said at least one separating apparatus, continuously separating said at least one second light-weight non-metallic constituent component from said at least one second light-weight metallic constituent component, and continuously returning said at least one second light-weight metallic constituent component to said at least one crushing and size reducing apparatus, simultaneously with step (b).

2. The process of claim 1, further comprising the following step of (e) providing said at least one electronic circuit board in a shredded state without cryogenic processing before step (a).

3. The process of claim 1, further comprising the following steps of (a1) transporting said at least one electronic circuit board to and between said at least one crushing and size reducing apparatus with at least one first closed conveyor extending to a first crushing and size reducing apparatus and from said first crushing said size reducing apparatus to a second crushing and size reducing apparatus, said first and second crushing and size reducing apparatus of said at least one crushing and size reducing apparatus to perform step (a); and (b1) transporting said plurality of crushed electronic components to a separating apparatus with a second closed conveyor extending from said at least one crushing and size reducing apparatus to said at least one separating apparatus to perform step (c).

4. The process of claim 1, wherein said specific size is a diameter approximately between 1/16" and 2".

5. The process of claim 1, wherein step (a) is comprised of the following substeps:

(a1) providing said at least one electronic circuit board to a first crushing and size reducing apparatus;

(a2) crushing and reducing said at least one electronic circuit board to create a first plurality of crushed electronic components with said first crushing and size reducing apparatus to ensure said first plurality of crushed electronic components substantially conforms to a first size;

(a3) transporting said first plurality of crushed electrical components to a second crushing and size reducing apparatus;

(a4) crushing and reducing said first plurality of crushed electronic components to create a second plurality of crushed electronic components with said second crushing and size reducing apparatus to ensure said second plurality of crushed electronic components substantially conforms to a second size;

(a5) transporting said second plurality of crushed electronic components to a third crushing and size reducing apparatus; and (a6) crushing and reducing said second plurality of crushed electronic components to create said plurality of crushed electronic components with said third crushing and size reducing apparatus, to ensure said third plurality of crushed electronic components substantially conforms to a third size.

6. The process of claim 5, wherein said second size is smaller than said first size and said third specific size is smaller than said second size.

7. The process of claim 6, wherein said first size is a diameter approximately between 1/16" and 2", said second size is a diameter approximately between 1/4" and 1", and said third size is a diameter approximately between 1/16" and 1/2".

8. The process of claim 1, wherein said separating apparatus is a fluidized bed separator.

9. The process of claim 1, further comprising the step of
(e) continuously removing said at least one first light-weight non-metallic electronic components, simultaneously with step (c) and continuously removing said at least one second light-weight non-metallic electronic components, simultaneously with step (d).

10. The process of claim 9, further comprising the step of
(f) depositing said at least one first light-weight non-metallic electronic component and second light-weight non-metallic electronic component in a bag house.

11. The process of claim 1, further comprising the step of shredding said at least one electronic circuit board before step (a) without prior cryogenic processing.

12. The process of claim 1, wherein said at least one electrical circuit board is selected from a group consisting of printed wiring assembly, printed wiring board, and trim scrap from printed wiring boards.

13. The process of claim 1, wherein steps (c) and (d) are performed with at least one non-magnetic separating apparatus.

14. A process to separate and isolate precious and semi-precious metals from at least one electronic circuit board, comprising the following steps:

(a) crushing and reducing said at least one electronic circuit board to create at least one first crushed electronic circuit board with a first crushing and size reducing machine to ensure said at least one first crushed electronic circuit board conforms to a first size;

(b) crushing and reducing said at least one first crushed electronic circuit board to create at least one second crushed electronic circuit board with a second crushing and size reducing machine to ensure said at least one second crushed electronic circuit board conforms to a second size;

(c) crushing and reducing said at least one second crushed electronic circuit board to create at least one third crushed electronic circuit board with a third crushing and size reducing machine to ensure said at least one third crushed electronic circuit board conforms to a third size;

(d) separating said at least one third crushed electronic circuit board from said third crushing and size reducing machine with at least one separating machine into said metallic portions and said non-metallic portions;

(e) continuously removing from said first crushed electronic circuit board at least one first light-weight non-metallic constituent component and at least one first light-weight metallic constituent component, continuously separating said at least one first light-weight non-metallic constituent component from said at least one first light-weight metallic constituent component, and continuously returning said at least one first light-weight metallic constituent component to said first crushing and size reducing machine;

(f) continuously removing from said second crushed electronic board at least one second light-weight non-metallic constituent component and at least one second light-weight metallic constituent component, continuously separating said at least one second light-weight non-metallic constituent component from said at least one second light-weight metallic constituent component, and continuously returning said at least one second light-weight metallic constituent component to said second crushing and size reducing machine;

(g) continuously removing from said third crushed electronic board at least one third light-weight non-metallic constituent component and at least one third light-weight metallic constituent component, continuously separating said at least one third light-weight non-metallic constituent component from said at least one third light-weight metallic constituent component, and continuously returning said at least one third light-weight metallic constituent component to said third crushing and size reducing machine; and (h) continuously removing at least one fourth light-weight non-metallic constituent component and at least one fourth light-weight metallic constituent component from said separating apparatus, continuously separating said at least one fourth light-weight non-metallic constituent component from said at least one fourth light-weight metallic constituent component, and continuously returning said at least one fourth light-weight metallic constituent component to said third crushing and size reducing apparatus.

15. The process of claim 14, further comprising the following steps of (a1) transporting said at least one first crushed electronic circuit board from said first crushing and size reducing machine to said second crushing machine after step (a);

(b1) transporting said at least one second crushed electronic circuit board from said second crushing and size reducing machine to said third crushing machine after step (b); and (c1) transporting said at least one third crushed electronic circuit board from said third crushing and size reducing machine to said separating machine after step (c).

16. The process of claim 15, wherein said first, second, and third crushing and size reducing machines are selected from a group consisting of ring mills, radial knife granulators, roll crushers, jaw crushers, ball mills, disk granulators, impact mills, and hammer mills.

17. The process of claim 14, wherein said separating machine is selected from a group consisting of a fluidized bed separator and a gravity separator.

18. The process of claim 14, wherein said first size is a diameter approximately between 1/16" and 2", said second size is a diameter approximately between 1/4" and 1", and said third size is a diameter approximately between 1/16" and 1/2".

19. The process of claim 14, further comprising the step of
(i) removing and gathering said at least one first light-weight non-metallic constituent component, said at least one second light-weight non-metallic constituent component, said at least one third light-weight non-metallic constituent component, and said fourth light-weight non-metallic constituent component.

20. The process of claim 19, further comprising:
(j) depositing said at least one first light-weight non-metallic constituent component, said at least one second light-weight non-metallic constituent component, said at least one third light-weight non-metallic congruent component, and said fourth light-weight non-metallic constituent component in a bag house filter.

21. The process of claim 14, further comprising the step of
(i) shredding said at least one electronic circuit board before step (a).

22. The process of claim 14, wherein said electronic circuit board is selected from the group consisting of printed wiring assembly, printed wiring board, and trim scrap from printed wiring boards.

23. The process of claim 14, wherein steps (e), (f), (g), and (h) are performed with at least one non-magnetic separating apparatus.

24. A process to substantially isolate precious and semi-precious metals from at least one electronic circuit board, comprising the following steps:
(a) crushing and reducing by size said at least one electronic circuit board to create a stream of a plurality of crushed electronic components;
(b) substantially removing at least one first light-weight non-metallic constituent component, if any, and at least one first light-weight metallic constituent component from said stream of said plurality of crushed electronic components, if any, substantially separating said at least one first light-weight non-metallic constituent component from said at least one first light-weight metallic constituent component, and substantially returning said at least one first light-weight metallic constituent component to said stream of said plurality of crushed electronic components;
(c) substantially separating by weight said plurality of crushed electronic components of said stream of said plurality of crushed electronic components into at least one non-metallic constituent component and at least one metallic constituent component to create a stream of separated crushed electronic components; and
(d) substantially removing at least one second light-weight non-metallic constituent component and at least one second light-weight metallic constituent component from said stream of separated crushed electronic components, substantially separating said at least one second light-weight non-metallic constituent component from said at least one second light-weight metallic constituent component, and substantially returning said at least one second light-weight metallic constituent component to said stream of said plurality of crushed electronic components.

25. The process of claim 24, further comprising the following step of
providing said at least one electronic circuit board in an unprocessed state before step (a).

26. The process of claim 24, wherein step (a) is reputed until each crushed electronic component of said plurality of crushed electronic component substantially conform to a specific size.

27. The process of claim 26, wherein said specific size is a diameter approximately between 1/16" and 2".

28. The process of claim 24, further comprising the step of
(e) continuously removing said at least one first light-weight non-metallic electronic components, simultaneously with step (c) and continuously removing said at least one second light-weight non-metallic electronic components, simultaneously with step (d) and
(f) depositing said at least one first light-weight non-metallic electronic component and second light-weight non-metallic electronic component in a bag house.

29. The process of claim 24, further comprising the step of
shredding said at least one electronic circuit board before step (a).

30. The process of claim 24, wherein said electronic circuit board is selected from a group consisting of printed wiring assembly, printed wiring board, and trim scrap from printed wiring boards.

31. The process of claim 24, wherein step (a) is performed by at least one crushing and size reducing apparatus and step (c) is performed by at least one separating apparatus, and comprising the following steps of:
(e) transporting said stream of said plurality of crushed electronic components to said at least one crushing and size reducing apparatus;
(f) transporting said stream of said plurality of crushed electronic components from a first crushing and size reducing apparatus to a second crushing and size reducing apparatus; and
(g) transporting said stream of said plurality of crushed electronic components from said at least one crushing and size reducing apparatus to said at least one separating apparatus.

32. The process of claim 24, wherein step (c) and (d) are performed with at least one non-magnetic separating apparatus.

33. A process to substantially separate and isolate precious and semi-precious metals from at least one electronic circuit board, comprising the following steps:
(a) providing said at least one electronic circuit board;
(b) crushing and reducing in size said at least one electronic circuit board to create at least one first crushed electronic circuit board with a first crushing and size reducing machine to ensure said at least one first crushed electronic circuit board conforms to a first size;
(c) transporting said at least one first crushed electronic circuit board from said first crushing and size reducing machine to a second crushing and size reducing machine in a first closed conveyor;
(d) crushing and reducing in size said at least one first crushed electronic circuit board to create at least one second crushed electronic circuit board with said second crushing and size reducing machine to ensure said at least one second crushed electronic circuit board conforms to a second size;
(e) transporting said at least one second crushed electronic circuit board from said second crushing and size reducing machine to a third crushing and size reducing machine in a second closed conveyor;
(f) crushing and reducing in size said at least one second crushed electronic circuit board to create at least one third crushed electronic circuit board with said third crushing and size reducing machine to ensure said at last one third crushed electronic circuit board conforms to a third size;

(g) transporting said at least one third crushed electronic circuit board from said third crushing and size reducing machine to a at least one separating apparatus in s third closed conveyor;

(h) separating said at least one third crushed electronic circuit board from said third crushing and size reducing machine with said at least one gravity-based separating machine into said metallic portions and said non-metallic portions;

(i) continuously removing from said first crushed electronic component at least one first light-weight non-metallic constituent component and at least one first light-weight metallic constituent component, continuously non-magnetically separating said at least one first light-weight non-metallic constituent component from said at least one first light-weight metallic constituent component, and continuously returning said at least one first light-weight metallic constituent component to said first closed conveyor;

(j) continuously removing from said second crushed electronic circuit board at least one second light-weight non-metallic constituent component and at least one second light-weight metallic constituent component, continuously non-magnetically separating said at least one second light-weight non-metallic constituent component from said at least one second light-weight metallic constituent component, and continuously returning said at least one second light-weight metallic constituent component of said second closed conveyor;

(k) continuously removing from said third crushed electronic circuit board at least one third light-weight non-metallic constituent component and at least one third light-weight metallic constituent component, continuously non-magnetically separating said at east one third light-weight non-metallic constituent component from said at least one third light-weight metallic constituent component, and continuously returning said at least one third light-weight metallic constituent component to said third crushing and size reducing machine; and (l) continuously removing at least one fourth light-weight non-metallic constituent component and at least one fourth light-weight metallic constituent component from said at least one separating apparatus, continuously non-magnetically separating said at least one fourth light-weight non-metallic constituent component from said at least one fourth light-weight metallic constituent component, and continuously returning said at least one fourth light-weight metallic constituent component to said third crushing and size reducing apparatus.

34. The process of claim 33, wherein said first, second, and third crushing and size reducing machines are selected from a group consisting of ring mills, radial knife granulators, roll crushers, jaw crushers, ball mills, disk granulators, impact mills, and hammer mills.

35. The process of claim 33, wherein said gravity-based separating machine is selected from a group consisting of a fluidized bed separator and a gravity separator.

36. The process of claim 33, wherein said first size is larger than said second size and said second size is larger than said third size.

37. The process of claim 33, wherein said first size is a diameter approximately between $\frac{1}{16}$" and 2", said second size is a diameter approximately between $\frac{1}{4}$" and 1", and said third size is a diameter approximately between $\frac{1}{16}$" and $\frac{1}{2}$".

38. The process of claim 33, further comprising the step of (m) removing and gathering said at least one first light-weight non-metallic constituent component, said at least one second light-weight non-metallic constituent component, said at least one third light-weight non-metallic constituent component, and said fourth light-weight non-metallic constituent component.

39. The process of claim 38, further comprising:

(n) depositing said at least one first light-weight non-metallic constituent component, said at least one second light-weight non-metallic constituent component, said at least one third light-weight non-metallic constituent component, and said fourth light-weight non-metallic constituent component in a bag house filter.

40. The process of claim 33, further comprising the step of shredding said at least one electronic circuit board before step (a).

41. The process of claim 33, wherein said electronic circuit board is selected from the group consisting of printed wiring assembly, printed wiring board, and trim scrap from printed wiring boards.

* * * * *